United States Patent [19]

Kobayashi et al.

[11] Patent Number: 5,141,973

[45] Date of Patent: Aug. 25, 1992

[54] METHOD OF PREPARING POLYVINYL ALCOHOL GEL

[75] Inventors: Tomokazu Kobayashi, Kawasaki; Toshio Morihiro, Yokohama, both of Japan

[73] Assignee: Nippon Oil Co., Ltd., Tokyo, Japan

[21] Appl. No.: 457,942

[22] Filed: Dec. 27, 1989

[30] Foreign Application Priority Data

Dec. 27, 1988 [JP] Japan .................. 63-327983

[51] Int. Cl.$^5$ .............................. C08J 3/28
[52] U.S. Cl. ................... 523/300; 523/307; 523/312; 524/56; 524/58; 524/364; 524/379; 524/388; 524/435; 524/494; 524/495; 524/503; 524/557
[58] Field of Search ............ 524/503, 557, 56, 58, 524/364, 379, 388, 435, 494, 495; 523/300, 307, 312

[56] References Cited

U.S. PATENT DOCUMENTS

| | | | |
|---|---|---|---|
| 4,012,352 | 3/1977 | Deyrup | 524/557 |
| 4,472,542 | 9/1984 | Nambu | 524/557 |
| 4,734,097 | 3/1988 | Tanabe et al. | 524/557 |
| 4,737,533 | 4/1988 | Charmot et al. | 524/503 |
| 4,772,641 | 9/1988 | Meltz et al. | 524/503 |
| 4,774,957 | 10/1988 | Nambu et al. | 524/557 |
| 4,788,242 | 11/1988 | Takahashi et al. | 524/503 |
| 4,916,170 | 4/1990 | Nambu et al. | 524/557 |
| 4,939,203 | 7/1990 | Marrocco | 524/557 |

*Primary Examiner*—Joseph L. Schofer
*Assistant Examiner*—J. M. Reddick
*Attorney, Agent, or Firm*—Keil & Weinkauf

[57] ABSTRACT

A method of preparing a polyvinyl alcohol hydrogel contains the steps of charging an aqueous solution of a polyvinyl alcohol having a degree of hydrolysis of not less than 95 mol % and an average polymerization degree of not less than 500 into a container, the aqueous solution containing the polyvinyl alcohol in a concentration of not less than 5 wt. %, cooling the aqueous solution of the polyvinyl alcohol at a temperature of from − (minus) 9° C. to − (minus) 3° C., subjecting the aqueous solution of the polyvinyl alcohol to physical stimulation, and then maintaining the aqueous solution of the polyvinyl alcohol at a temperature of from − (minus) 5° C. to + (plus) 5° C. The polyvinyl alcohol hydrogel may be contained in a plastic container. An MRI phanton is composed of the plastic container containing such polyvinyl alcohol hydrogel.

9 Claims, 1 Drawing Sheet

METHOD OF PREPARING POLYVINYL ALCOHOL GEL

BACKGROUND OF THE INVENTION

1. Field of the Invention

The present invention relates to a method of preparing a polyvinyl alcohol hydrogel, a method of preparing the polyvinyl alcohol hydrogel contained in a plastic container and a Magnetic Resonance Imaging (MRI) phantom made of the polyvinyl alcohol hydrogel contained in the plastic container.

2. Related Art Statement

A process for preparing a polyvinyl alcohol hydrogel by subjecting an aqueous solution of a polyvinyl alcohol to freezing treatment has been known, for example, by Japanese Patent Publication No. 12854/1972. This prior publication discloses that a container and an aqueous solution of a polyvinyl alcohol contained in the container are subjected to freezing treatment at a temperature below − (minus) 5° C. However, as described in this publication, a satisfactory polyvinyl alcohol hydrogel cannot be formed unless the temperature is lowered within the range of − (minus) 15° C. and − (minus) 50° C. In addition, the gel prepared by this known process is relatively soft and weak.

Another process has been known by Japanese Laid-open Patent Application No. 130543/1982, in which an aqueous solution of a polyvinyl alcohol is frozen and the frozen mass is then dehydrated to prepare a gel having high strength. In this known process, an aqueous solution of a polyvinyl alcohol is contained in a container and frozen and molded at a temperature of lower than − (minus) 6° C. to obtain a molded mass, which is dried in vacuum without thawing the same to prepare a gel having high strength. However, in practice, as will be seen from the Examples and the description in the Publication, a molded mass is prepared by freezing the aqueous solution at a relatively lower temperature of from − (minus) 20° C. to − (minus) 80° C. prior to the drying in vacuum.

On the other hand, Japanese Laid-open Patent Application No. 247440/1986 discloses a phantom used for diagnosis by MRI, which is made of a gel prepared by cooling to freeze an aqueous solution of a polyvinyl alcohol at a temperature of below − (minus) 10° C., followed by thawing, additional freezing-thawing cycles being repeated by 2 to 7 times.

Japanese Laid-open Patent Application No. 153056/1988 discloses a phantom provided with at least one sample receiving port, which is prepared by charging an aqueous solution of a polyvinyl alcohol into a plastic container and subjecting the aqueous solution in the container to freezing and thawing treatment.

Although these prior publications disclose prominent technology for preparing polyvinyl alcohol gels, and disclose a phantom made of a polyvinyl alcohol gel and used for MRI diagnosis or disclose that the polyvinyl alcohol hydrogel prepared by the freezing-thawing cycles has appreciably superior properties over those of the known phantoms for MRI diagnosis, freezing must be effected at a low temperature of below − (minus) 10° C. in the practical working of the processes, leading to expansion of the frozen mass during the freezing step to cause various problems.

In detail, when an aqueous solution of a polyvinyl alcohol is contained in a plastic container and frozen at a temperature defined by the known processes, the container is broken as will be described hereinafter in the Comparative Examples. When the plastic container described in the above mentioned Japanese Laid-open Patent Application No. 153056/1988 is used, a considerably large empty space must be left in the upper portion of the plastic container, and the expanding polyvinyl alcohol gel rises into the empty space to form irregular surface, and in addition, strain or stress is developed throughout the frozen mass. Accordingly, a further improvement is required to prepare a gel having dimensional stability. A still more improvement is demanded for preparing a phantom for MRI diagnosis in which accuracy in dimensions is required, as will be described in detail in the Comparative Example.

On the other hand, as will be described in detail in the comparative Example, when an aqueous solution of a polyvinyl alcohol is not brought to a low temperature of below − (minus) 10° C. but is cooled to a moderate cooling temperature of about − (minus) 5° C., a jelly-like gel is formed and the gel is returned back to an aqueous solution as the temperature is raised to room temperature, and thus a polyvinyl alcohol gel cannot be formed.

OBJECTS AND SUMMARY OF THE INVENTION

An object of this invention is to provide a method of preparing a polyvinyl alcohol hydrogel effectively while obviating expansion of volume caused by cooling at a low temperature of below − (minus) 10° C. during the hydrogel forming step to thereby alleviate the resulting unstableness in the dimensions of the formed hydrogel.

Another object of this invention is to provide a method wherein a polyvinyl alcohol hydrogel is prepared in a plastic container to provide a composite material which can be used directly as a finished product.

A further object of this invention is to provide a phantom for MRI diagnosis, which is composed of a polyvinyl alcohol hydrogel sealingly contained in a plastic container.

The above and other objects of the invention will become apparent from the following description.

With the aforementioned objects in view, the present invention provides a method of preparing a polyvinyl alcohol hydrogel, comprising the steps of charging an aqueous solution of a polyvinyl alcohol having a degree of hydrolysis of not less than 95 mol % and an average polymerization degree of not less than 500 into a container, the aqueous solution containing the polyvinyl alcohol in a concentration of not less than 5 wt %, cooling the aqueous solution of the polyvinyl alcohol at a temperature of from − (minus) 9° C. to − (minus) 3° C., subjecting the aqueous solution of the polyvinyl alcohol to physical stimulation, and then maintaining the aqueous solution of the polyvinyl alcohol at a temperature of from − (minus) 5° C. to + (plus) 5° C.

The present invention also provides a method of preparing a polyvinyl alcohol hydrogel contained in a plastic container, comprising the steps of charging an aqueous solution of a polyvinyl alcohol having a degree of hydrolysis of not less than 95 mol % and an average polymerization degree of not less than 500 into a plastic container, the aqueous solution containing the polyvinyl alcohol in a concentration of not less than 5 wt %, cooling the aqueous solution of the polyvinyl alcohol at a temperature of from − (minus) 9° C. to − (minus) 3° C., subjecting the aqueous solution of the polyvinyl alcohol to physical stimulation, and then maintaining the aqueous solution of the polyvinyl alcohol at a temperature of from − (minus) 5° C. to + (plus) 5° C.

According to a further aspect of the invention, there is provided an MRI phantom comprising a polyvinyl alcohol hydrogel contained in a plastic container, the hydrogel being prepared by a method comprising the steps of charging an aqueous solution of a polyvinyl alcohol having a degree of hydrolysis of not less than 95 mol % and an average polymerization degree of not less than 500 into a plastic container, the aqueous solution containing the polyvinyl alcohol in a concentration of not less than 5 wt %, cooling the aqueous solution of the polyvinyl alcohol at a temperature of from − (minus) 9° C. to − (minus) 3° C., subjecting the aqueous solution of the polyvinyl alcohol to physical stimulation, and then maintaining the aqueous solution of the polyvinyl alcohol at a temperature of from − (minus) 5° C. to + (plus) 5° C.

DESCRIPTION OF THE INVENTION

Figure 1:
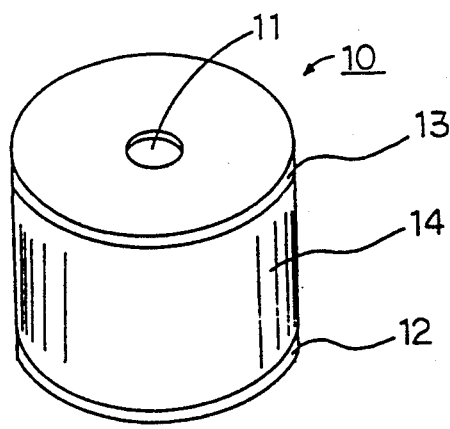
FIG. 1 is a perspective view of an acrylic resin container used in the practice of the invention.

The present invention will now be described in detail.

The polyvinyl alcohol used in this invention has a degree of hydrolysis of not less than 95 mol %, preferably not less than 98 mol %. If the polyvinyl alcohol used has a lower degree of hydrolysis, satisfactory gelation cannot be effected. The polyvinyl alcohol used in this invention should have an average polymerization degree of not less than 500, preferably from 1000 to 1700. If the polymerization degree of the polyvinyl alcohol used is less than 500, satisfactory gelation cannot be effected. On the contrary, if the polymerization degree of the polyvinyl alcohol is too high, the formed gel tends to exhibit intense syneresis. In this invention, an aqueous solution containing 5 wt % or more of such a polyvinyl alcohol is used.

It is a common practice to add a solid polyvinyl alcohol into cold or warm water, followed by heating under agitation, to dissolve the polyvinyl alcohol to prepare an aqueous solution. In the present invention, since the water content of the formed hydrogel has a direct connection with the concentration of polyvinyl alcohol in the aqueous solution used, it is recommendable that the concentration of polyvinyl alcohol in the aqueous solution be determined at this stage to prepare a hydrogel having a desired water content. It is difficult to form a hydrogel if the concentration of polyvinyl alcohol in the aqueous solution is less than 5 wt %. On the contrary, it becomes difficult to handle the resultant aqueous solution due to increase in viscosity, if the concentration of polyvinyl alcohol in the solution is too high. The concentration of polyvinyl alcohol in the starting aqueous solution may range generally from about 5 to 50 wt %, for example, may be controlled within the range of from about 7 to 50 wt % to prepare a hydrogel having a desired water content.

According to the present invention, the aqueous solution is contained in a container having a desired shape. The container may have any desired shape, and a container having a complicated shape can be used in this invention since expansion of the aqueous solution of polyvinyl alcohol during the processing steps is obviated or alleviated, according to the present invention, and thus there is no fear of bursting or rupture of the container. As will be described in detail hereinafter, in case where a phantom for an MRI diagnosis system is to be prepared, a member detectable by an MRI system such as at least one precisely machined part for the inspection of the MRI system having various shapes may be contained in the container. Likewise, the dimensions of the container are not limited, and a container of large volume can be used without the fear of bursting since expansion of the aqueous solution of polyvinyl alcohol during the processing steps is obviated. For example, a small container having a diameter of 1 cm may be used, and a large container having a diameter of 30 cm or more corresponding to the diameter of the torso of human being may also be used. It is preferred that the container is sealed by a cap or a plug.

According to the invention, a hydrogel contained in a container is prepared, and thus such a product prepared in accordance with the invention is particularly suited for use in condition under which the hydrogel contained in the container is applied for use as it is.

The aqueous solution of polyvinyl alcohol contained in the container is then cooled to a temperature of from − (minus) 9° C. to − (minus) 3° C. If the cooling temperature is lower than − (minus 9° C., expansion due to cooling becomes large, leading to bursting or breaking of the container when a plastic or glass container is used, as will be described in Comparative Example. If the cooling temperature is higher than − (minus) 3° C., it becomes difficulty to form a gel. Preferable cooling temperature in the present invention is from − (minus) 7° C. to − (minus) 5° C. In the present invention, the aqueous solution of polyvinyl alcohol may preferably be placed in a refrigerator maintained at a temperature for bringing the content in the container to a preset temperature for a predetermined time, for example, for 1 to 24 hours.

It becomes difficult to form a satisfactory gel if the aqueous solution of polyvinyl alcohol is not cooled for sufficient time period. However, the aqueous solution need not be cooled for a redundantly long time from the economical viewpoint. Although the viscosity of the aqueous solution of polyvinyl alcohol is increased and the fluidity thereof is lowered, the solution is still transparent and the hydrogel is not yet formed at this stage. Accordingly, as will be described in Comparative Example, if the temperature of the solution is raised to room temperature, the solution is returned back to the normal aqueous solution of polyvinyl alcohol and hydrogel cannot be obtained.

According to an important feature of the present invention, the aqueous solution of polyvinyl alcohol cooled at a temperature within the defined range is subjected to physical stimulation. Effective physical stimulation which may be used in this invention is stimulation applied from the outside of the cooled mass to give some energies to the polyvinyl alcohol molecules cooled at that temperature, the examples being application of vibrating sonic wave, ultrasonic wave, change in pressure, change in temperature and irradiation of a laser beam.

Otherwise, a small amount of water, ice or a variety of polyvinyl alcohol gels (for example, a gel prepared by the method of this invention, or a gel prepared by cooling to a temperature of lower than — (minus) 10° C. according to the known processes) may be added. By the addition of such a material, the polyvinyl alcohol molecules on the surface of the cooled aqueous solution of polyvinyl alcohol are stimulated to give rise to formation of nuclei for gelation. Change in pressure includes increase and decrease of pressure in the cooled aqueous solution of polyvinyl alcohol, and gelation of the cooled aqueous solution of polyvinyl alcohol may be initiated by changing the pressure in the order of about 10 mm Hg. When the aqueous solution of polyvinyl alcohol is cooled in a sealed container, effective change in pressure may be attained by removing a cap or plug of the container after cooling.

Such stimulation is just a trigger for initiating gelation, and thus it is not necessary to apply the stimulation continuously throughout the gel forming step. Once gelation takes place, the formed gel stimulates the cooled aqueous solution of polyvinyl alcohol surrounding the formed gel so that chain reaction of gelation continues spontaneously. For example, as pressure change is applied on the surface of the cooled aqueous solution of polyvinyl alcohol, cloudy gel is first formed in a small area on the surface and the gelled area spreads with the lapse of time, and the entire mass of the aqueous solution of polyvinyl alcohol is converted into a hydrogel.

When it is desired to from a large volume of hydrogel, it is preferable from the economical standpoint to stimulate plural spots of the aqueous solution to decrease the time required for gelating the whole mass.

However, as described hereinafter in the Comparative Example, if the temperature of the gel formed by the application of physical stimulation is returned back to room temperature, the resultant gel is just an extremely soft and weak gel which is soluble in water.

An additional important feature of the present invention resides in that the gel formed by the application of physical stimulation is maintained at a relatively low temperature ranging from — (minus) 5° C. to + (plus) 5° C. for a relatively long time. In detail, after the gelation is completed, the formed gel is maintained at a temperature of from — (minus) 5° C. to + (plus) 5° C., preferably from — (minus) 3° C. to 0° C., for a certain time period, whereby a polyvinyl alcohol hydrogel has a strength at room temperature considerably higher than that of the hydrogel without subjecting to such treatment of maintaining at relatively low temperature. The polyvinyl alcohol hydrogel after being treated by this step of maintaining at the relatively low temperature for a certain period is not swollen in water.

An appreciable effect can be obtained by maintaining the gel at the temperature as aforementioned for not less than 3 hours, preferably for 10 hours or more.

The polyvinyl alcohol hydrogel formed according to the invention has a preset water content, and is not dissolved in or swollen by water. Furthermore, as will be demonstrated by the following Examples, water removal due to syneresis is suppressed to a negligible extent. As will be also demonstrated by the following Examples, the polyvinyl alcohol hydrogel prepared by the method of this invention has the properties comparable to those of the hydrogels prepared by the known processes, and thus may be used directly as a material simulating living tissues, a phantom for MRI diagnosis system, a phantom used in diagnosis wherein an ultrasonic wave is used, and a material used for remedial purposes.

As described hereinbefore, since the change in volume due to expansion of hydrogel is negligibly small in the present invention and there is no fear of rupture or damage of the container even when the aqueous solution of polyvinyl alcohol is contained in a plastic container and converted into the hydrogel as it is contained in the container, the formed hydrogel may be used directly without removing the same from the container.

Accordingly, the method of the invention is particularly advantageous to prepare a product which is used as a phantom for MRI diagnosis system and includes precisely machined parts for the inspection of MRI system having various complicated shapes contained in a container. According to the method of the invention, such a product which has a complicated configuration and must have precise dimensions can be prepared only by one cycle operation including the sequential steps as aforementioned.

The plastic container as used throughout the specification and appended claims means the container made of any of acrylic resins, polyvinylchloride resins, polyethylene, polypropylene, polyamides, polystyrene, celluloid, cellulose acetate, chlorinated rubbers, phenolic resins, urea resins, melamine resins, fluorinated resins, polycarbonate, polyacetal resins, polyalkyleneoxide, alkyd resins, furan resins, unsaturated polyester resins, epoxy resins, polyurethane resins and silicon resins. The material for the plastic container may be selected from these resins.

A glass container may also be used as desired.

In the present invention, a polyvinyl alcohol is used singly as a gelling material (gelling component). However, other ingredients or additives, which do not hinder gelation of polyvinyl alcohol, may be present. The amount of one or more coexisting additives may be controlled, for example, in the range of not more than one half in weight of the polyvinyl alcohol contained in the aqueous solution.

Examples of the additives which do not hinder gelation of polyvinyl alcohol include, for example, various metal ions such as $Mn^{2+}$, $Ni^{2+}$, $Cu^{2+}$, $Fe^{2+}$ and $Fe^{3+}$, glycerin, methyl alcohol, ethyl alcohol, isopropyl alcohol, acetone, agar, carrageenan, glucose and graphite. Any one or more of these additives may be added directly to the aqueous solution of polyvinyl alcohol or they may be added in water to prepare an aqueous solution or suspension and then added to the aqueous solution of polyvinyl alcohol, followed by stirring to disperse uniformly, and the mixture is subjected to the steps of the invention.

EXAMPLES OF THE INVENTION

The present invention will now be described more specifically with reference to some Examples thereof.

Example 1

A 12 wt % aqueous solution of a polyvinyl alcohol having an average polymerization degree of 1000 and a degree of hydrolysis of 99 mol % was charged into a glass bottle having an inner diameter of 33 mm and a height of 100 mm and provided with a screwed cap. The glass bottle and the content therein were placed in a refrigerator maintained at — (minus) 7° C. After the lapse of 6 hours, the content in the bottle was stimulated by a pressure difference of 76 mmHg, whereby the area vicinal to the opening of the aqueous solution in the bottle became cloudy to show initiation of gelation and the cloudy portion spread gradually. After confirming visually that gelation had been completed (about 2 hours later), the temperature in the refrigerator was adjusted to − (minus) 3° C. and the bottle and the content therein were allowed to stand for additional 16 hours. Thereafter, the temperature of the content in the bottle was raised to room temperature to obtain a white opaque gel which had a shape retention property and rubber-like resiliency. Throughout the sequential operations, cracking or other damage of the glass bottle was not observed.

A sample was taken from the thus formed gel and wrapped with filter paper to confirm that the gel did not stick to the filter paper. 10.0 grams of the gel was immersed in water and the change in weight was weighed. The result is shown in Table 1, and as seen from Table 1, swelling in water was not appreciable.

TABLE 1

| Time (day) | 1 | 2 | 3 | 4 | 5 | 6 | 7 |
|---|---|---|---|---|---|---|---|
| Weight (g) | 10.0 | 10.0 | 10.0 | 10.0 | 10.0 | 10.0 | 10.0 |

Comparative Example 1

The same aqueous solution of the same polyvinyl alcohol as used in Example 1 was charged into the same glass bottle as used in Example 1 and allowed to stand for 7 days in a refrigerator maintained at − (minus) 7° C. However, gelation did not take place. The temperature of the bottle and the content therein was returned back to room temperature to find that the aqueous solution of the polyvinyl alcohol was transparent and had the fluidity similar to that of the starting solution.

Comparative Example 2

Following the operations as in Example 1, the content in the bottle was stimulated by the application of the pressure difference similarly as in Example 1, and the temperature of the bottle and the content therein were returned back to room temperature without subjecting the same to the treatment of $-3°$ C.$\times 16$ hours, whereby a translucent gel was formed which gel was extremely soft and weak.

The gel was highly sticky and sticked to filter paper when it was wrapped by filter paper. 10.0 grams of the gel were immersed in water to learn swelling thereof in water to find that the sample mass was partly dissolved in water and the weight thereof could not be weighed.

Example 2

A 14 wt % aqueous solution of a polyvinyl alcohol having an average polymerization degree of 1700 and a degree of hydrolysis of 97 mol % was prepared and charged into a cylindrical container 10 (see FIG. 1) having an inner diameter of 180 mm and a height of 150 mm and made of a 5.0 mm thick acrylic resin through an upper opening 11 of the container 10. The container 10 and the content therein were allowed to stand in a refrigerator maintained at − (minus) 8° C. for 24 hours. A pressure of 30 mmHg was applied from the opening 11, whereupon gelation was initiated. Gelation was initiated from a portion vicinal to the opening 11 and gradually spread throughout the whole mass, and gelation was completed after the lapse of about 10 hours. Then, the temperature in the refrigerator was adjusted to 0° C. and the container was allowed to stand for additional 24 hours. The container was then removed from the refrigerator and inspected to find that the container was not damaged.

A portion of the gel was taken out as a sample and the modulus of elasticity was measured. The results are shown in Table 2. The gel prepared by this Example had the modulus of elasticity comparable to that of the gel prepared by the process disclosed in Japanese Laid-open Patent Application No. 247440/1986.

TABLE 2

| Temperature (°C.) | 25 | 35 | 45 |
|---|---|---|---|
| Modulus of Elasticity (N/m$^2$) | $3.1 \times 10^4$ | $3.1 \times 10^4$ | $3.1 \times 10^4$ |

Example 3

Figure 2:
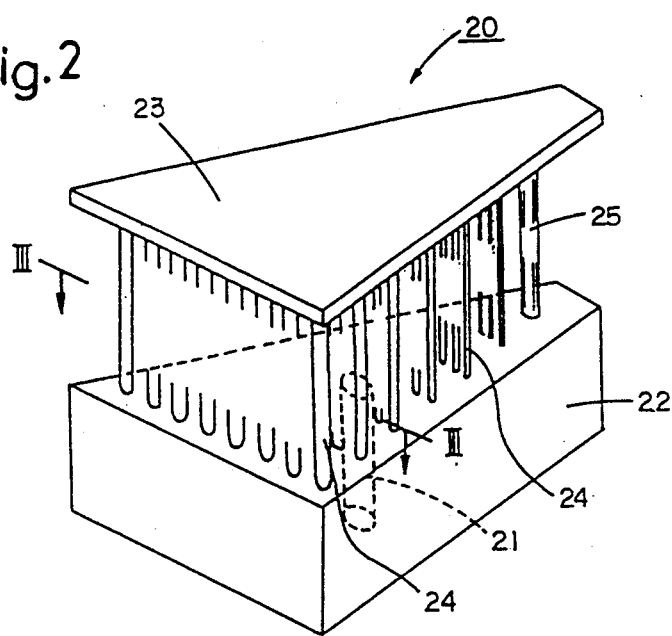
FIG. 2 is a perspective view showing, in an enlarged scale, a precisely machined part fixedly contained in the container and having plural fixed pins made of an acrylic resin.
Figure 3:
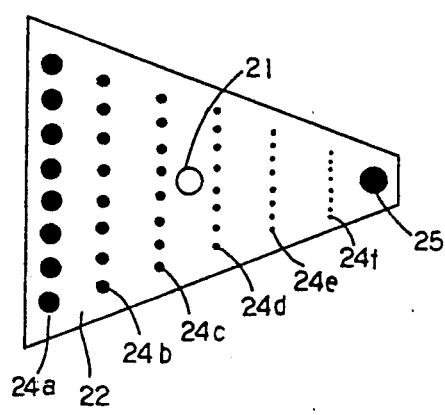
FIG. 3 is a sectional view taken along line III—III of FIG. 2.

A precisely machined part 20 as shown in FIG. 2 was fixed on a bottom 12 of the same acrylic resin container 10 as used in Example 2 by means of a screw (not shown), which was thrust into a threaded bore 21. The precisely machined part 20 comprised a lower support plate 22, an upper support plate 23, and plural acrylic resin pins 24 having different diameters and extending between and fixed to the lower support plate 22 and the upper support plate 3. A reinforcing pin 25 was provided at one corner as shown in FIG. 2. The acrylic resin pins 24 included six groups of pins 24a to 24f having different diameters as best seen from FIG. 3. The diameters of pins and arrangement thereof are shown in Table 3.

TABLE 3

| Pin Group No. | Diameter of Pin (mm) | Spacing* between Pins (mm) | Length of Pin (mm) | Number of Pins |
|---|---|---|---|---|
| 24a | 3 | 3 | 35 | 8 |
| 24b | 2 | 2 | 35 | 8 |
| 24c | 1.5 | 1.5 | 35 | 8 |
| 24d | 1.0 | 1.0 | 35 | 8 |
| 24e | 0.75 | 0.75 | 35 | 8 |
| 24f | 0.50 | 0.50 | 35 | 8 |

*Note:
Spacing between respective pins each having the same diameter.

An 18 wt % aqueous solution of a polyvinyl alcohol having an average polymerization degree of 1400 and a degree of hydrolysis of 98.5 mol % was charged into the container 10 through the upper opening 11, and then the container and the content therein were placed in a refrigerator maintained at − (minus) 5° C. After allowing to stand for 30 hours, few drops of water were added to the content in the container through the opening 11 to initiate gelation. After the lapse of 10 hours, the temperature in the refrigerator was adjusted to − (minus) 2° C., and the container and the content therein were allowed to stand for 26 hours before they were taken out from the refrigerator. The gel in which the precisely machined part 20 is buried was placed in an X-ray CT apparatus and in an MRI diagnosis apparatus, together with the container, and the content in the container was inspected by photographing along the horizontal direction to take 12 sheets of photographed image, followed by inspection of the photographed images. The result was that no abnormality was found and the precisely machined part 20 retained its configuration just the same as it was installed.

Comparative Example 3

The same aqueous solution of the same polyvinyl alcohol as used in Example 2 was charged into the same container 10 as used in Example 2, and then the container and the content therein were placed in a refrigerator maintained at − (minus) 30° C., followed by repeated freezing and thawing steps in accordance with the known process to effect gelation of the content. The result was that damage of the container (formation of cracking) began after the lapse of 15 hours, the damage of the container being developed so that both of the bottom plate 12 and the lid 13 were separated from the side wall 14 and were isolated nearly completely with the formation of cracking on the side wall 14 (cylindrical portion) of the container after the lapse of 22 hours. It was judged that the same could not be used as a finished product.

Comparative Example 4

In order to prevent the damage of the container as observed in Comparative Example 3, an experiment was conducted by decreasing the charged quantity of the aqueous solution of the polyvinyl alcohol to 90% in volume. As the result, although damage of the container was suppressed to some extent, about ⅔ of the circumference of the bottom plate 12 was separated from the side wall 14 and crackings were formed around about a half of the circumference of the adhering portion between the lid 13 and the side wall (cylindrical portion) 14. It was judged that the container and the content therein could not be applied for practical use.

Comparative Example 5

A stainless steel container having the dimensions substantially the same as those of the container as used in Example 2 was made. The stainless container had a wall thickness of 8 mm, an inner diameter of 180 mm and a height of 150 mm. After fixing the same precisely machined part 20 made of the same acrylic resin as used in Example 3 to the bottom plate using an acrylic resin screw, the lid was fixed to the side wall using stainless steel screws. The same aqueous solution of the polyvinyl alcohol as used in Example 3 was charged into the stainless steel container, and the container was placed in a refrigerator maintained at (minus) 30° C., followed by repeated freezing and thawing steps (known process) to effect gelation. The stainless steel screws were loosened to remove the thus formed gel containing therein the buried precisely machined part 20 from the container. In order to prevent drying of the gel, the gelled mass was transferred into an acrylic resin container having a wall thickness of 5.0 mm, an inner diameter of 180 mm and a height of 150 mm, and the container was sealed by covering with a lid. The gelled mass contained in the acrylic resin container was placed in an X-ray CT apparatus and an MRI diagnosis system to inspect the inner portion thereof by photographing along the horizontal direction to take 12 sheets of the photographed image to find damages of the precisely machined part 20. In detail, 2 mm diameter and 3 mm diameter pins were impaired partly and the pins each having diameter of not more than 1 mm were bent apparently, and it was judged that the gelled mass could not be applied for practical use.

Example 4

The sample contained in the container and prepared by Example 3 (Sample A) and the sample contained in the container and prepared by Comparative Example 5 (Sample B) were placed in two MRI diagnosis systems, respectively, having a static magnetic field strength of 0.5 T and 1.5 T, and the $T_1$ values were measured by the Inversion Recovery Method (Pulse Repetition Time $T_r=3000$ ms, Pulse Delay time $T_d=50$ to 2000 ms), and the $T_2$ values were also measured by the Spin-echo Method ($T_r=2000$ ms, Echo time $T_e=40$ ms).

The measurements were repeated 4 times for every measurements, and the temperature in the room was maintained at 23° to 24.5° C. during the measuring operations.

The results are shown in Table 4. As seen from the Table, the Sample A prepared by the method of this invention had the MRI properties ($T_1$, $T_2$) comparable to those of the Sample B prepared by the known process (as disclosed in Japanese Laid-open Patent Application No. 247440/1986), and satisfied the requirements as to the MRI informations (Proton Density, $T_1$ and $T_2$ Values) for use as a model equivalent to living body.

TABLE 4

| Static Magnetic Field Strength | 0.5T | | 1.5T | |
|---|---|---|---|---|
| Measured Value | $T_1$ (ms) | $T_2$ (ms) | $T_1$ (ms) | $T_2$ (ms) |
| Sample A | 550-571 | 95-100 | 795-810 | 121-129 |
| Sample B | 525-543 | 98-104 | 788-804 | 123-131 |

Example 5

In consideration of the fact that the water contents of the high water content hydrogels prepared by the method of the invention cover the range of from 65% to 92%, syneresis of the hydrogels with the lapse of long storage time was inspected.

A 20 wt % aqueous solution of a polyvinyl alcohol having an average polymerization degree of 1000 and a degree of hydrolysis of 98 mol % was charged into a mold frame having a length of 30 cm, a width of 30 cm and a height of 1.5 cm. After allowing the aqueous solution in the frame to stand in a refrigerator maintained at − (minus) 6° C. for 6 hours, a ultrasonic wave having a frequency of 1 MHz was irradiated to initiate gelation. After allowing to stand at that temperature for 8 hours, the temperature in the refrigerator was adjusted to − (minus) 2° C. and the content in the mold frame was allowed to stand for additional 12 hours, whereby a hydrogel having a shape of flat plate was prepared. The hydrogel was cut to prepare nine specimens each having the dimensions of 10 cm × 10 cm × 1.5 cm, and the weight of each specimen was weighed. Each of the specimens was wrapped with "SALAN WRAP" (Trade name), Asahi Chemical Industry Co., Ltd., and placed in a sealed container which could be opened as desired. After allowing stand in the sealed container maintained at room temperature for 176 days, each specimen was removed from the wrapping film and water drops formed on the surface thereof were carefully wiped off, and the weight of each specimen was weighed again.

The results are shown in Table 5. As seen, removal of water due to syneresis during the storage at room temperature over a time period of about a half year was so little as 0.770 wt % as the mean value. It was thus ascertained that syneresis of the hydrogel prepared by this invention was suppressed to the level casing no problem in practical use.

TABLE 5

| Specimen No. | Weight (g) | | Change in Weight (%) $(1 - (2)/(1)) \times 100$ |
|---|---|---|---|
| | Immediately after Preparation (1) | After the Lapse of 176 Days (2) | |
| 1 | 156.3 | 155.4 | 0.576 |
| 2 | 155.5 | 154.4 | 0.707 |
| 3 | 158.2 | 157.0 | 0.759 |
| 4 | 154.2 | 152.9 | 0.843 |
| 5 | 150.0 | 148.8 | 0.800 |
| 6 | 158.8 | 157.7 | 0.693 |
| 7 | 158.1 | 156.9 | 0.759 |
| 8 | 157.9 | 156.9 | 0.633 |
| 9 | 153.0 | 151.8 | 0.784 |
| Average | 155.8 | 154.6 | 0.770 |

Although the present invention has been described with reference to specific examples, it should be understood that various modifications and variations can be easily made by a person having ordinary skill in the art without departing from the spirit and scope of the invention. Accordingly, the foregoing disclosure should be interpreted as illustrative only and not to be interpreted in a limiting sense. The present invention is limited only by the scope of the following claims.

What is claimed is:

1. A method of preparing a polyvinyl alcohol hydrogel, comprising the steps of charging an aqueous solution of a polyvinyl alcohol having a degree of hydrolysis of not less than 95 mol % and an average polymerization degree of not less than 500 into a container, said aqueous solution containing said polyvinyl alcohol in a concentration of not less than 5 wt %, cooling said aqueous solution of said polyvinyl alcohol at a temperature of from − (minus) 9° C. to − (minus) 3° C., subjecting said aqueous solution of said polyvinyl alcohol to physical stimulation by the application of stimulating means selected from the group consisting of vibrating sonic wave, ultrasonic wave, change in pressure, change in temperature and irradiation of a laser beam or by the addition of a material selected from the group consisting of water, ice, a polyvinyl alcohol gel and mixtures thereof, and then maintaining said aqueous solution of said polyvinyl alcohol at a temperature of from − (minus) 5° C. to + (plus) 5° C.

2. A method of preparing a polyvinyl alcohol hydrogel contained in a plastic container, comprising the steps of charging an aqueous solution of a polyvinyl alcohol having a degree of hydrolysis of not less than 95 mol % and an average polymerization degree of not less than 500 into a plastic container, said aqueous solution containing said polyvinyl alcohol in a concentration of not less than 5 wt %, cooling said aqueous solution of said polyvinyl alcohol at a temperature of from − (minus) 9° C. to − (minus) 3° C., subjecting said aqueous solution of said polyvinyl alcohol to physical stimulation by the application of stimulating means selected from the group consisting of vibrating sonic wave, ultrasonic wave, change in pressure, change in temperature and irradiation of a laser beam or by the addition of a material selected from the group consisting of water, ice, a polyvinyl alcohol gel and mixtures thereof, and then maintaining said aqueous solution of said polyvinyl alcohol at a temperature of from − (minus) 5° C. to + (plus) 5° C.

3. The method according to claim 1 or 2, wherein said polyvinyl alcohol has a degree of hydrolysis of not less than 98 mol %.

4. The method according to claim 1 or 2, wherein said polyvinyl alcohol has an average polymerization degree of 1000 to 1700.

5. The method according to claim 1 or 2, wherein said aqueous solution contains 5 to 50 wt % of said polyvinyl alcohol.

6. The method according to claim 1 or 2, wherein to said aqueous solution of said polyvinyl alcohol there is added one or more additives which do not hinder gelation of said polyvinyl alcohol.

7. The method according to claim 6, wherein said additive is selected from the group consisting of $Mn^{2+}$, $Ni^{2+}$, $Cu^{2+}$, $Fe^{2+}$, $Fe^{3+}$, glycerin, methyl alcohol, ethyl [$Ni^{2+}$, $Cu^{2+}$, $Fe^{2+}$, $Fe^{3+}$, glycerin, methyl alcohol, ethyl] alcohol, isopropyl alcohol, acetone, agar, carrageenan, glucose, graphite and mixtures thereof.

8. The method according to claim 1, wherein said container is made of glass.

9. The method according to claim 2, wherein said container is made of a material selected from the group consisting of acrylic resins, polyvinylchloride resins, polyethylene, polypropylene, polyamides, polystyrene, celluloid, cellulose acetate, chlorinated rubbers, phenolic resins, urea resins, melamine resins, fluorinated resins, polycarbonate, polyacetal resins, polyalkyleneoxide, alkyd resins, furan resins, unsaturated polyester resins, epoxy resins, polyurethane resins, and silicon resins.

* * * * *

UNITED STATES PATENT AND TRADEMARK OFFICE
CERTIFICATE OF CORRECTION

PATENT NO. : 5,141,973
DATED : August 25, 1992
INVENTOR(S) : KOBAYASHI et al.

It is certified that error appears in the above-identified patent and that said Letters Patent is hereby corrected as shown below:

Columns 12, lines 35,36: delete " [$Ni^{2+}$, $Cu^{2+}$, $Fe^2$, $Fe^{3+}$, glycerin, methyl alcohol, ethyl]".

Signed and Sealed this

Thirty-first Day of August, 1993

Attest:

BRUCE LEHMAN

*Attesting Officer*  *Commissioner of Patents and Trademarks*